(12) United States Patent
Sugiura et al.

(10) Patent No.: US 10,943,847 B2
(45) Date of Patent: Mar. 9, 2021

(54) SEMICONDUCTOR CHIP AND SEMICONDUCTOR DEVICE (71) Applicant: DENSO CORPORATION, Kariya (JP)

(72) Inventors: Kazuhiko Sugiura, Kariya (JP); Tomohito Iwashige, Kariya (JP); Jun Kawai, Kariya (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/216,044

(22) Filed: Dec. 11, 2018

(65) Prior Publication Data
US 2019/0109067 A1 Apr. 11, 2019

Related U.S. Application Data (63) Continuation of application No. PCT/JP2017/023980, filed on Jun. 29, 2017.

(30) Foreign Application Priority Data

Jul. 4, 2016 (JP) .............................. JP2016-132565

(51) Int. Cl.
*H01L 23/373* (2006.01)
*H01L 23/62* (2006.01)
(Continued)

(52) U.S. Cl.
CPC ............ *H01L 23/373* (2013.01); *H01L 23/36* (2013.01); *H01L 23/40* (2013.01); *H01L 23/58* (2013.01);
(Continued)

(58) Field of Classification Search
CPC ....... H01L 23/373; H01L 23/40; H01L 24/26; H01L 2021/60007; H01L 2224/05105;
(Continued)

(56) References Cited

U.S. PATENT DOCUMENTS 3,413,442 A * 11/1968 Buiting ................... F27D 11/02
219/390
3,811,938 A * 5/1974 Hirose ................... H01C 7/022
427/102
(Continued)

FOREIGN PATENT DOCUMENTS

JP H08-260077 A 10/1996
JP H10-259024 A 9/1998
(Continued)

*Primary Examiner* — David A Zarneke
(74) *Attorney, Agent, or Firm* — Posz Law Group, PLC (57) ABSTRACT

A semiconductor device includes a semiconductor chip having an electrode portion and a joining member electrically connected to the electrode portion to allow an electric current to flow in the semiconductor chip through the joining member. The joining member contains a protective material that has a positive temperature coefficient of resistivity, and the positive temperature coefficient of resistivity has a larger value in a temperature range higher than a threshold temperature than in a temperature range lower than the threshold temperature, the threshold temperature being a predetermined temperature lower than a breakdown temperature of the semiconductor chip. The electrode portion of the semiconductor chip may contain the protective material.

10 Claims, 4 Drawing Sheets

(51) Int. Cl.
*H01L 29/739* (2006.01)
*H01L 23/40* (2006.01)
*H01L 29/78* (2006.01)
*H01L 23/58* (2006.01)
*H01L 23/36* (2006.01)
*H01L 25/18* (2006.01)
*H01L 25/07* (2006.01)
*H01L 29/12* (2006.01)
*H01L 23/00* (2006.01)

(52) U.S. Cl.
CPC .............. *H01L 23/62* (2013.01); *H01L 24/48* (2013.01); *H01L 25/07* (2013.01); *H01L 25/18* (2013.01); *H01L 29/12* (2013.01); *H01L 29/739* (2013.01); *H01L 29/78* (2013.01); *H01L 2224/32245* (2013.01); *H01L 2224/33* (2013.01); *H01L 2224/48091* (2013.01); *H01L 2224/48247* (2013.01); *H01L 2224/73265* (2013.01); *H01L 2924/00014* (2013.01); *H01L 2924/13055* (2013.01); *H01L 2924/13091* (2013.01)

(58) Field of Classification Search
CPC .......... H01L 2224/05147; H01L 2224/05176; H01L 2224/05305; H01L 2224/05347; H01L 2224/05376; H01L 2224/1315; H01L 2224/13147; H01L 2224/13605; H01L 2224/13611; H01L 2224/13847; H01L 2224/13947; H01L 2224/13976; H01L 2224/13876; H01L 2224/13676; H01L 2224/13647; H01L 2224/13111; H01L 2224/13176; H01L 2224/13305; H01L 2224/13311; H01L 2224/13405; H01L 2224/13447; H01L 2224/13805; H01L 2224/13811; H01L 2224/13911; H01L 2224/13476; H01L 2224/13411; H01L 2224/13376; H01L 2224/13347; H01L 23/62

See application file for complete search history.

(56) References Cited

U.S. PATENT DOCUMENTS

| | | | | |
|---|---|---|---|---|
| 3,934,058 | A * | 1/1976 | Seebacher | H01C 17/286 427/103 |
| 5,313,184 | A * | 5/1994 | Greuter | H01C 7/10 338/14 |
| 5,491,118 | A | 2/1996 | Hormadaly | |
| 6,100,745 | A | 8/2000 | Dougherty | |
| 7,999,363 | B2 * | 8/2011 | Hebert | H01L 24/49 257/666 |
| 8,441,109 | B2 * | 5/2013 | Hebert | H01L 24/49 257/666 |
| 8,900,983 | B1 * | 12/2014 | Hebert | H01L 24/40 438/584 |
| 2006/0055056 | A1 | 3/2006 | Miura et al. | |
| 2008/0006897 | A1 | 1/2008 | Inaguchi et al. | |
| 2008/0180871 | A1 | 7/2008 | Hebert et al. | |
| 2012/0201582 | A1 | 8/2012 | Shimura et al. | |
| 2014/0193182 | A1 | 7/2014 | Shimura et al. | |

FOREIGN PATENT DOCUMENTS

| | | |
|---|---|---|
| JP | H10-280069 A | 10/1998 |
| JP | 2007-018912 A | 1/2007 |

* cited by examiner

SEMICONDUCTOR CHIP AND SEMICONDUCTOR DEVICE

CROSS REFERENCE TO RELATED APPLICATIONS

The present application is a continuation application of International Patent Application No. PCT/JP2017/023980 filed on Jun. 29, 2017, which designated the U.S. and claims the benefit of priority from Japanese Patent Application No. 2016-132565 filed on Jul. 4, 2016. The entire disclosures of all of the above applications are incorporated herein by reference.

TECHNICAL FIELD

The present disclosure relates to a semiconductor chip having an electrode portion electrically connected to a joining member, and a semiconductor device.

BACKGROUND

It has been conventionally proposed a semiconductor device in which a first heat radiation member, a joining member, a semiconductor chip, a joining member, a heat radiation block, a joining member and a second heat radiation member are stacked in this order. As the semiconductor chip, one having a metal oxide semiconductor field effect transistor (MOSFET) element or an insulated gate bipolar transistor (IGBT), which has a gate electrode and allows an electric current to flow in a thickness direction of the semiconductor chip, is used. The first heat radiation member and the second heat radiation member are thermally and electrically connected to the semiconductor chip, respectively, through the joining members. The first heat radiation member and the second heat radiation member serve to dissipate heat generated from the semiconductor chip and serve as wirings that form a current path of the electric current flowing in the semiconductor chip.

Such a semiconductor device is switched between an on state in which the electric current is allowed to flow in the semiconductor chip and an off state in which the electric current is not allowed to flow in the semiconductor chip by controlling a drive voltage applied to the gate electrode.

SUMMARY

According to an aspect, the present disclosure provides a semiconductor device including a semiconductor chip and a joining member that is electrically connected to an electrode portion of the semiconductor chip to allow an electric current to flow in the semiconductor chip through the joining member.

According to another aspect, the present disclosure provides a semiconductor chip including an electrode portion and a semiconductor element.

DETAILED DESCRIPTION

It has been known a semiconductor device in which a first heat radiation member, a joining member, a semiconductor chip, a joining member, a heat radiation block, a joining member and a second heat radiation member are stacked in this order. As the semiconductor chip, one having a metal oxide semiconductor field effect transistor (MOSFET) element or an insulated gate bipolar transistor (IGBT), which has a gate electrode and allows an electric current to flow in a thickness direction of the semiconductor chip, is used. The first heat radiation member and the second heat radiation member are thermally and electrically connected to the semiconductor chip, respectively, through the joining members. The first heat radiation member and the second heat radiation member serve to dissipate heat generated from the semiconductor chip and serve as wirings that form a current path of the electric current flowing in the semiconductor chip.

Such a semiconductor device is switched between an on state in which the electric current is allowed to flow in the semiconductor chip and an off state in which the electric current is not allowed to flow in the semiconductor chip by controlling a drive voltage applied to the gate electrode.

In such a semiconductor device, if a short-circuit occurs between the first heat radiation member and the second heat radiation member for some reasons, a large current flows in the semiconductor chip, resulting in a rapid increase in temperature of the semiconductor chip. Further, when the temperature of the semiconductor chip reaches a breakdown temperature, there is a possibility that the semiconductor chip will be broken.

To address such issues, it is conceivable to arrange a temperature detecting element such as a thermistor and to adjust a drive voltage to be applied to the gate electrode based on a detection result of the temperature detecting element. In other words, when the detected temperature is equal to or higher than a threshold temperature, the drive voltage is lowered to cut off the electric current flowing in the semiconductor chip, so as to restrict the temperature of the semiconductor chip from reaching the breakdown temperature.

In such a method, however, since the drive voltage is adjusted after the temperature is detected, a responsiveness is likely to be low, and there is a possibility that the semiconductor device will be broken before the drive voltage is lowered.

According to an aspect of the present disclosure, a semiconductor device includes a semiconductor chip and a joining member. The semiconductor chip has an electrode portion, and the electrode portion is electrically connected to the joining portion to allow an electric current to flow in the semiconductor chip through the joining member. The joining member is configured to contain a protective material that has a positive temperature coefficient of resistivity, and the positive temperature coefficient of resistivity is larger in a temperature range that is higher than a threshold temperature than in a temperature range that is lower than the threshold temperature. The threshold temperature is a predetermined temperature that is lower than a breakdown temperature of the semiconductor chip.

In such a configuration, when the temperature of the semiconductor chip increases due to a large current flowing in the semiconductor chip, the temperature of the joining member also increases. In the joining member, the resistivity of the protective material steeply increases when the temperature exceeds the threshold temperature. Therefore, the current flowing in the semiconductor chip can be reduced. As such, it is possible to suppress the temperature of the semiconductor chip from reaching the breakdown temperature and to improve the durability. In addition, since the resistivity of the protective material changes with the temperature, it is less likely that the responsiveness will deteriorate.

According to another aspect of the present disclosure, in addition to the protective material, the joining member may contain a base material that has a resistivity lower than that of the protective material.

In such a configuration, as compared to the case where the joining member is provided only by the protective material, it is possible to restrict an increase in the resistivity as a whole when the semiconductor device is used at a temperature lower than the threshold temperature. As such, an increase in conduction loss can be suppressed.

According to further another aspect of the present disclosure, a semiconductor chip has an electrode portion and a semiconductor element. The electrode portion is configured to contain a protective material that has a positive temperature coefficient of resistivity, and the positive temperature coefficient is larger in a temperature range higher than a threshold temperature than that in a temperature range lower than the threshold temperature. The threshold temperature is a predetermined temperature that is lower than a breakdown temperature of the semiconductor element.

In such a configuration, when the temperature of the semiconductor chip increases due to a large current flowing in the semiconductor chip, the temperature of the electrode portion also increases. In this case, the resistivity of the protective material steeply increases when the temperature of the electrode portion exceeds the threshold temperature, which is lower than the breakdown temperature of the semiconductor chip by the predetermined temperature. Thus, the current flowing in the semiconductor chip can be reduced. As such, by setting the threshold temperature suitably for the characteristics of the semiconductor chip based on the breakdown temperature, it is possible to suppress the temperature of the semiconductor chip from reaching the breakdown temperature and thus to improve the durability. In addition, since the resistivity of the protective material changes with the temperature, it is less likely that the responsiveness will deteriorate.

Hereinafter, embodiments of the present disclosure will be described with reference to the drawings. In the following embodiments, the same or equivalent parts are denoted by the same reference numerals.

First Embodiment

Figure 1:
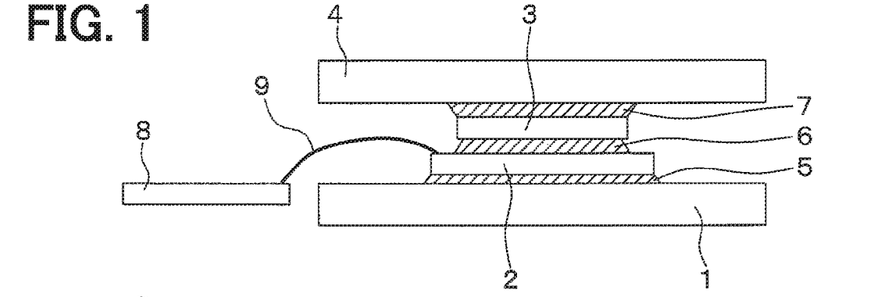
FIG. 1 is a diagram illustrating a cross-sectional view of a semiconductor device according to a first embodiment.

A first embodiment will be described hereafter with reference to the drawings. In a semiconductor device of the present embodiment, as shown in FIG. 1, a semiconductor chip 2 is disposed on a first heat radiation member 1, and a second heat radiation member 4 is disposed on a semiconductor chip 2 through a heat radiation block 3. A first joining member 5 is disposed between the first heat radiation member 1 and the semiconductor chip 2, and a second joining member 6 is disposed between the semiconductor chip 2 and the heat radiation block 3. A third joining member 7 is disposed between the heat radiation block 3 and the second heat radiating member 4. Further, as will be described later, the semiconductor chip 2 of the present embodiment is provided with a gate pad 20. The gate pad 20 is electrically connected to a gate terminal 8 via a bonding wire 9. In the present embodiment, the bonding wire 9 corresponds to an external member.

Figure 2:
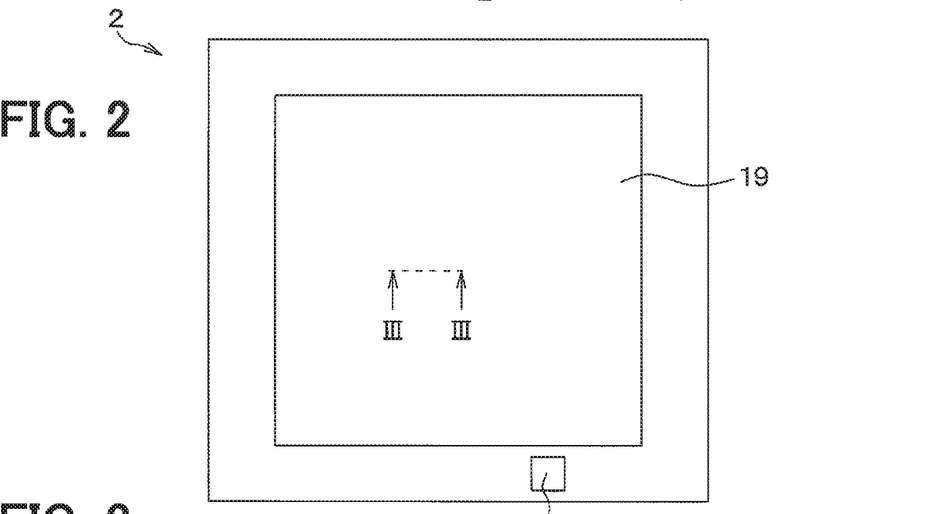
FIG. 2 is a diagram illustrating a plan view of a semiconductor chip.
Figure 3:
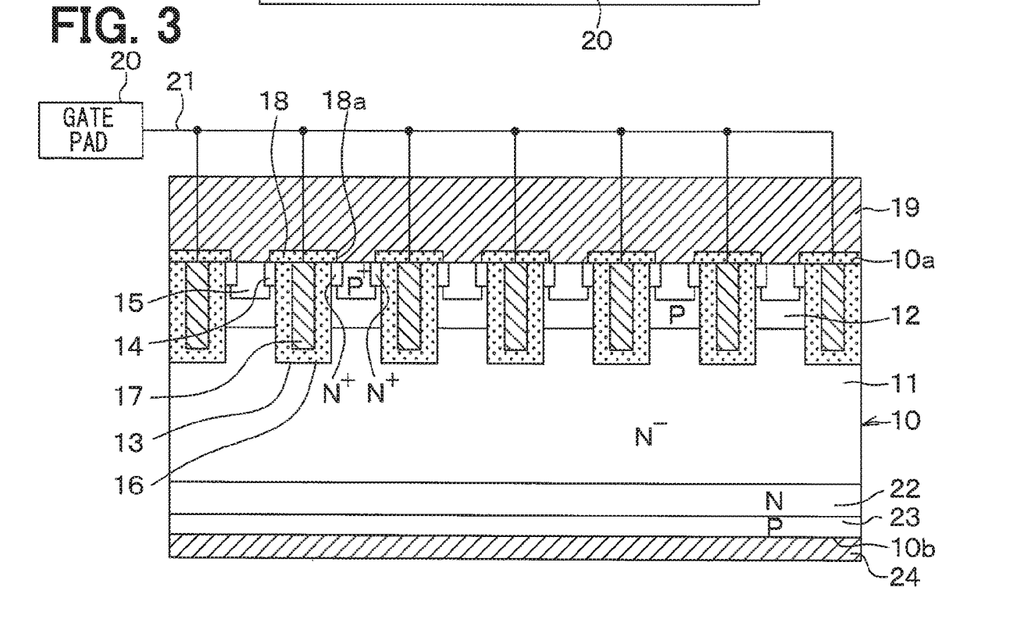
FIG. 3 is a diagram illustrating a cross-sectional view taken along a line III-III in FIG. 2.

The semiconductor chip 2 is provided with a semiconductor element, such as a power element which allows a large current to flow. In the present embodiment, a semiconductor chip provided with an IGBT element is used as the semiconductor chip 2, as shown in FIG. 2 and FIG. 3. Hereinafter, the configuration of the semiconductor chip 2 of the present embodiment will be briefly described with reference to FIG. 2 and FIG. 3.

The semiconductor chip 2 includes a semiconductor substrate 10 having an $N^-$-type drift layer 11. A P-type base layer 12, which functions as a channel layer, is formed on the drift layer 11 (that is, on a side adjacent to a surface 10 of the semiconductor substrate 10). In the present embodiment, a SiC substrate, a GaN substrate, a diamond substrate, or the like is used as the substrate. The semiconductor chip 2 is thus configured to be able to operate stably even at high temperatures. The semiconductor substrate 10 is formed with a plurality of trenches 13 that penetrate through the base layer 12 and reach the drift layer 11. The base layer 12 is separated into plural sections by the trenches 13.

The plurality of trenches 13 are formed at an equal interval along one direction that is a planar direction along the surface 10a of the semiconductor substrate 10. Note that the one direction is a direction perpendicular to the paper surface of FIG. 3. The surface 10a of the substrate 10 is provided by a surface of the base layer 12 opposite to the drift layer 11.

In the surface layer portion of the base layer 12, N type emitter regions 14 and $P^+$ type body regions 15 are formed. The $P^+$ type body regions 15 are disposed between the emitter regions 14. The emitter regions 14 have a higher impurity concentration than the drift layer 11. The emitter regions 14 are terminated within the base layer 12, and are formed to be in contact with the side surface of the trenches 13. On the other hand, the body regions 15 have a higher impurity concentration than the base layer 12, and are formed so as to terminate within the base layer 12, similarly to the emitter regions 14.

Each trench 13 is filled with a gate insulating film 16 and a gate electrode 17. The gate insulating film 16 is formed to cover the wall surface of the trench 13. The gate electrode 17 is made of polysilicon or the like, and is formed on the gate insulating film 16. Thus, a trench gate structure is provided.

An interlayer insulating film 18, which is made of Boro Phospho Silicate Glass (BPSG) or the like, is formed on the base layer 12 (that is, on the surface 10a of the semiconductor substrate 10). The interlayer insulating film 18 is formed with contact holes 18a to expose a part of the emitter regions 14 and the body regions 15.

An upper electrode 19 is formed on the interlayer insulating film 18. The upper electrode 19 is electrically connected to the emitter regions 14 and the body regions 15 through the contact holes 18a. That is, the upper electrode 19 functions as an emitter electrode. In the present embodiment, the upper electrode 19 corresponds to an electrode portion and a second electrode.

In addition to the upper electrode 19, the semiconductor substrate 10 is formed with a gate pad 20 adjacent to the surface 10a. The gate pad 20 is electrically connected to the respective gate electrodes 17 via gate wirings 21 wired between the gate pad 20 and the gate electrodes 17. Although not specifically illustrated, in the semiconductor substrate 10, various pads are formed adjacent to the surface 10a, in addition to the gate pad 20.

An N type field stop layer (hereinafter simply referred to as the FS layer) 22 is formed in the drift layer 11 on a side opposite to the base layer 12 (that is, on a side adjacent to the other surface 10b of the semiconductor substrate 10). Although the FS layer 22 is not always necessary, the FS layer 22 is provided so as to enhance the performance on the withstand voltage and the steady loss by restricting expansion of the depletion layer, and so as to control the injection amount of holes injected from the other surface 10b of the semiconductor substrate 10.

A P-type collector layer 23 is formed opposite to the drift layer 11 with respect to the FS layer 22. A lower electrode 24 is formed on the collector layer 23 (that is, on the other surface 10b of the semiconductor substrate 10). In the present embodiment, the lower electrode 24 corresponds to an electrode portion and a first electrode.

The semiconductor chip 2 of the present embodiment has the configuration as described hereinabove. In the semiconductor chip 2, for example, the upper electrode 19 is grounded and the lower electrode 24 is applied with a positive voltage. Further, the gate electrode 17 is applied with the drive voltage via the gate pad 20 and the gate wiring 21. Specifically, the gate electrode 17 is applied with a voltage equal to or higher than the threshold voltage Vth of the insulated gate structure. As a result, an inversion layer is formed in a portion of the base layer 12 in contact with the trench 13 in which the gate electrode 17 is disposed. Thus, electrons are supplied from the emitter region 14 to the drift layer 11 through the inversion layer, and holes are supplied from the collector layer 23 to the drift layer 11, to thereby make the semiconductor chip 2 in an on state. That is, electric current flows in the thickness direction of the semiconductor chip 2.

As shown in FIG. 1, the heat radiation block 3 is disposed between the semiconductor chip 2 and the second heat radiation member 4 to electrically and thermally connect the semiconductor chip 2 and the second heat radiation member 4. For example, the heat radiation block 3 is made of a material, such as copper (Cu), which has high electrical conductivity and high thermal conductivity. In the present embodiment, the heat radiation block 3 has a rectangular parallelepiped shape. The heat radiation block 3 is electrically and thermally connected to the upper electrode 19 on the front side of the semiconductor chip 2 via the second joining member 6 and is electrically and thermally connected to the second heat radiation member 4 via the third joining member 7.

The first heat radiation member 1 and the second heat radiation member 4 each function as a heat radiation plate that diffuses and dissipates the heat generated in the semiconductor chip 2 over a wide range. For example, the first heat radiation member 1 and the second heat radiation member 4 are formed of Cu, which has a high electrical conductivity and a high heat transfer coefficient, as a base.

Further, the first heat radiation member 1 and the second heat radiation member 4 may each have a gold plating on its surface as necessary.

The first heat radiation member 1 is electrically connected to the lower electrode 24 on the back side of the semiconductor chip 2 via the first joining member 5. In addition to the function as the heat radiation plate, the first heat radiation member 1 also functions as wiring. Similarly, the second heat radiation member 4 is also electrically connected to the upper electrode 19 on the front side of the semiconductor chip 2 via the heat radiation block 3. In addition to the function as the heat radiation plate, the second heat radiation member 4 also functions as wiring connected to the upper electrode 19.

The semiconductor device of the present embodiment has the above described configuration as a basic configuration. Next, a configuration of the first joining member 5 of the present embodiment will be described.

Figure 4:
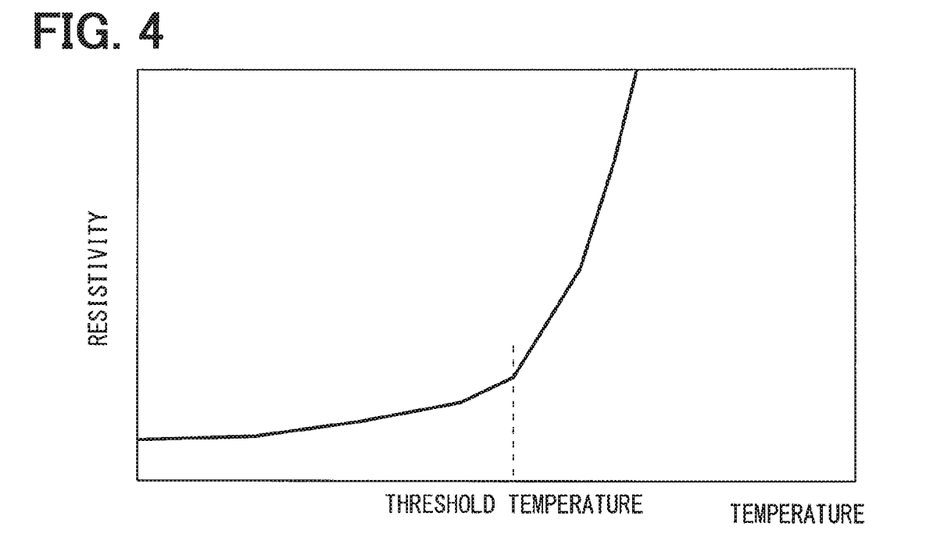
FIG. 4 is a diagram illustrating a relationship between the temperature and the resistivity of a base material.

In the present embodiment, the first joining member 5 includes a base material and a protective material. In the present embodiment, silver (Ag), which has a low resistivity even at a high temperature (for example, approximately 250°) is used as the base material. As the protective material, as shown in FIG. 4, a material that has a positive temperature coefficient of resistivity, and that the value of the positive temperature coefficient is larger in a temperature range higher than a threshold temperature than in a temperature range lower than the threshold temperature is used. The threshold temperature is set to a temperature that is lower than the breakdown temperature of the semiconductor chip 2 (that is, semiconductor element) by a predetermined temperature. That is, as the protective material, one exhibiting a steep increase in the resistivity in the temperature range higher than the threshold temperature is used. As examples of the protective material having such characteristics, metal oxides such as ruthenium oxide ($RuO_2$), barium titanate ($BaTiO_3$), copper oxide (CuO), or gallium oxide ($Ga_2O_3$) may be used. It is preferable that the protective material is suitably selected according to the threshold temperature based on the breakdown temperature of the semiconductor chip 2. The first joining member 5 is formed by applying a paste containing powder of the protective material and the base material, and sintering the paste.

Note that the base material is not limited to Ag, but Cu or the like can be used, for example. A material having a resistivity lower than that of the protective material is used as the base material. Further, the protective material is not limited to the metal oxide, but may be provided by a material other than oxide, as long as it has the positive temperature coefficient of resistivity and that has the larger value in the temperature range higher than the threshold temperature than in the temperature range lower than the threshold temperature. Note that, in the case where the metal oxide is used as the protective material, Ag or the like, which has no characteristic change due to the oxide, is preferably used.

The first joining member 5 has the configuration as described hereinabove. In the present embodiment, the second joining member 6 and the third joining member 7 have the similar configuration to the first joining member 5, and each of the second joining member 6 and the third joining member 7 includes a base material and a protective material.

As described above, in the semiconductor device of the present embodiment, the first joining member 5, the second joining member 6, and the third joining member 7 are configured to each include the base material and the protective material. The protective material uses one having the positive temperature coefficient of resistivity, which has a larger value in the temperature range higher than the threshold temperature than in the temperature range lower than the threshold temperature, the threshold temperature being set lower than the breakdown temperature of the semiconductor chip 2 by the predetermined temperature.

Therefore, for example, when a short circuit occurs between the first heat radiation member 1 and the second heat radiation member 4, a large current flows through the semiconductor chip 2. In this case, the temperature of the semiconductor chip 2 rises due to the large current flowing in the semiconductor chip 2. As a result, the temperatures of the first to third joining members 5 to 7 also rise. When the temperatures of the first to third joining members 5 to 7 exceed the threshold temperature, the resistivity of the protective material steeply increases. Therefore, the current flowing in the semiconductor chip 2 can be reduced. As such, the temperature of the semiconductor chip 2 can be restricted from reaching the breakdown temperature, or the time until reaching the breakdown temperature can be elongated. Accordingly, durability can be improved. Since the resistivity of the protective material varies with temperature, the responsiveness does not decrease.

The configuration of the semiconductor device of the present embodiment can be applied to a semiconductor device that has a temperature detecting element such as a thermistor and adjusts the driving voltage to be applied to the gate pad 20 based on the temperature. In this case, since the resistivity of the protective material increases on the basis of the temperature, it is possible to earn a period of time from the temperature detection to the adjustment of the drive signal. Therefore, even when a large current flows through the semiconductor chip 2, the semiconductor chip 2 can be further restricted from being destroyed.

In the present embodiment, each of the first joining member 5, the second joining member 6, and the third joining member 7 contains the base material having a lower resistivity than that of the protective material. Therefore, as compared with the case where the first joining member 5, the second joining member 6, and the third joining member 7 are made of only the protective material, an increase in the overall resistivity at a low temperature (for example, at room temperature) can be restricted, and an increase in conduction loss at the low temperature can be restricted.

That is, according to the semiconductor device of the present embodiment, at the low temperature, durability can be improved while suppressing conduction loss.

As the metal oxide, there are many materials having characteristics in which the temperature coefficient has a positive value. When the metal oxide is used as the protective material, a material suitable as the protective material can be selected according to the characteristics of the semiconductor chip 2. In a case where the protective material uses a metal oxide, when Ag is used as the base material, it is less likely that the characteristics of the base material will be changed due to the protective material.

Second Embodiment

A second embodiment will be described. In the present embodiment, the configurations of the first to third joining members 5 to 7 are modified from those of the first embodiment. The other configurations are similar to those of the first embodiment, and thus descriptions thereof will be omitted.

Figure 5:
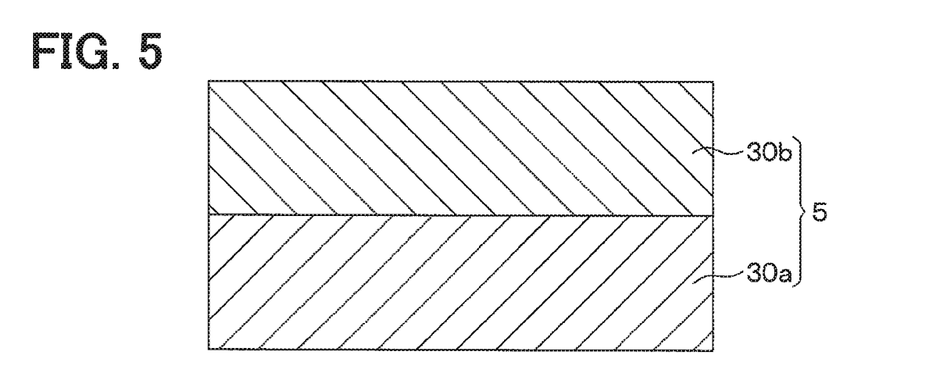
FIG. 5 is a diagram illustrating a cross-sectional view of a first joining member according to a second embodiment.

In the present embodiment, as shown in FIG. 5, the first joining member 5 is provided by a stack of a base layer 30a made of a base material and a protective layer 30b made of a protective material. The base layer 30a is made by sintering a paste containing powder of Ag as the base material. The protective layer 30b is made by sintering a paste containing powder of a metal oxide as the protective material.

Although not specifically illustrated, in the present embodiment, the second joining member 6 and the third joining member 7 have the similar configuration to the first joining member 5.

As described above, even when the first joining member 5, the second joining member 6 and the third joining member 7 are each provided by the stack of the base layer 30a and the protective layer 30b, the effects similar to the first embodiment can be achieved.

Third Embodiment

A third embodiment will be described. In the present embodiment, the configurations of the first to third joining members 5 to 7 are modified from those of the first embodiment. The other configurations are similar to the first embodiment, and thus descriptions thereof will be omitted.

Figure 6:
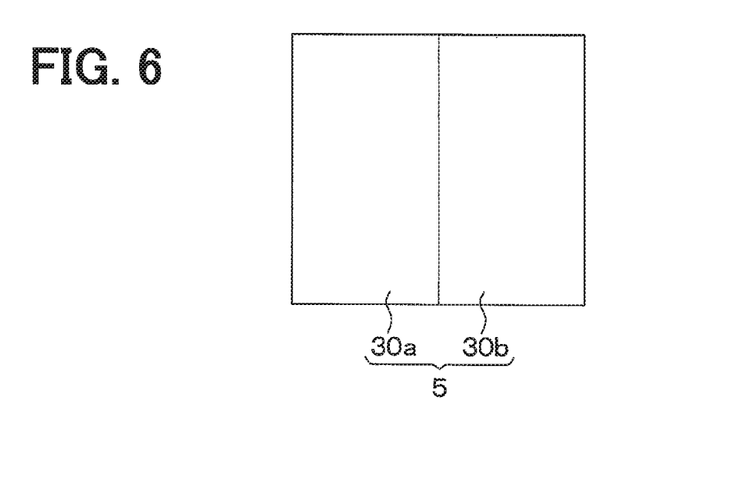
FIG. 6 is a diagram illustrating a plan view of a first joining member according to a third embodiment.

In the present embodiment, as shown in FIG. 6, the first joining member 5 has a configuration in which the base layer 30a and the protective layer 30b are arranged in a divided manner in a planar direction. Specifically, in the present embodiment, the base layer 30a and the protective layer 30b are provided in two divided regions having the area ratio of 1:1.

Although not specifically illustrated, in the present embodiment, the second joining member 6 and the third joining member 7 have the similar configuration to the first joining member 5. Note that the planar direction is a direction along the planar direction of the semiconductor chip 2. In other words, the planar direction is a direction along the surface 10a of the semiconductor substrate 10.

Even when the first joining member 5, the second joining member 6, and the third joining member 7 are each provided by the base layer 30a and the protective layer 30b, which are sectioned in the planar direction, the effects similar to those of the first embodiment can be achieved. In addition, in such a semiconductor device, since the base layer 30a and the protective layer 30b are sectioned in the planar direction, for example, the first heat radiation member 1 and the semiconductor chip 2 share a portion that is electrically connected only via the base layer 30a. Therefore, in the current path between the first heat radiation member 1 and the semiconductor chip 2, the resistivity is reduced at the portion connecting only via the base layer 30a, and thus the conduction loss can be suppressed at a low temperature.

Fourth Embodiment

A fourth embodiment will be described. The present embodiment is provided by combining the configuration of the second embodiment and the configuration of the third embodiment. The other configurations are similar to those of the first embodiment, and thus descriptions thereof will be omitted.

Figure 7:
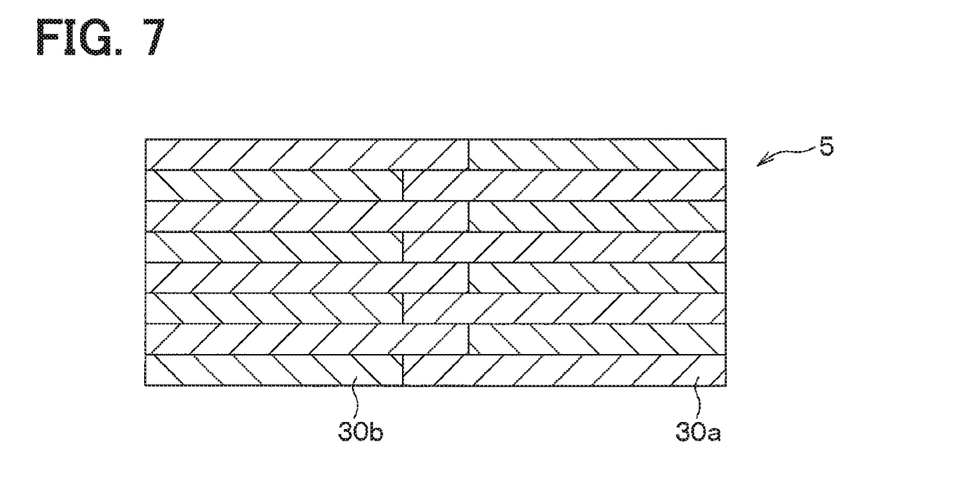
FIG. 7 is a diagram illustrating a cross-sectional view of a first joining member according to a fourth embodiment.

In the present embodiment, as shown in FIG. 7, the first joining member 5 is provided by a stack of layers each layer having the base layer 30a and the protective layer 30b sectioned in the planar direction. In the present embodiment, the layers are arranged such that the base layers 30a are continuously connected in a stacking direction. Although not specifically illustrated, in the present embodiment, the second joining member 6 and the third joining member 7 have the similar configuration to the first joining member 5.

As described above, even when the first joining member 5, the second joining member 6, and the third joining member 7 are each provided by stacked layers each layer including the base layer 30a and the protective layer 30b sectioned in the planar direction, the effects similar to those of the first embodiment can be achieved. In addition, since the base layers 30a are continuously connected in the stacking direction, the effects similar to those of the third embodiment can also be achieved.

Fifth Embodiment

A fifth embodiment will be described. In the present embodiment, the configuration of the gate pad 20 is modified from that of the first embodiment. The other configurations are similar to those of the first embodiment, and thus the descriptions thereof will be omitted.

In the present embodiment, although the basic configuration of the semiconductor chip 2 is similar to that of the first embodiment, the gate pad 20 has a configuration of including the above described base material and protective material, similarly to the configuration of the first joining member 5.

In such a case, since the gate pad 20 is configured to contain the protective material, when the temperature of the semiconductor chip 2 increases due to the large current flowing in the semiconductor chip 2, the temperature of the gate pad 20 also increases. As such, the resistivity of the protective material contained in the gate pad 20 also increases. That is, the driving voltage applied to the gate pad 20 can be automatically reduced to a voltage less than the threshold voltage Vth. In other words, the semiconductor chip 2 can be automatically turned off. Therefore, it is possible to suppress the temperature of the semiconductor chip 2 from rising to the breakdown temperature.

Other Embodiments

While the present disclosure has been described with reference to embodiments thereof, it is to be understood that the disclosure is not limited to the embodiments and constructions. The present disclosure is intended to cover various modification and equivalent arrangements. In addition, while the various combinations and configurations, other combinations and configurations, including more, less or only a single element, are also within the spirit and scope of the present disclosure.

For example, in the first to fifth embodiments, the semiconductor chip 2 having the IGBT element has been exemplarily described. However, the semiconductor chip 2 may have a MOSFET element without having the collector layer 23. Further, in the first to fourth embodiments, as the semiconductor chip 2, a semiconductor chip without a gate electrode 17, for example, a semiconductor chip having a diode element or the like may be used.

In the first embodiment described above, one or two of the first joining member 5, the second joining member 6, and the third joining member 7 may be configured to include the protective material and the base material, and the other may be configured only by the base material or only by the protective material. Similarly, in the second to fourth embodiments, one or two of the first joining member 5, the second joining member 6, and the third joining member 7 may be configured to include the base layer 30a and the protective layer 30b, and the other may be provided only by the base layer 30a or only by the protective layer 30b.

Further, the base layer 30a and the protective layer 30b may be arranged as follows. In the following, the first joining member 5 will be described as an example, but the second joining member 6 and the third joining member 7 may also have a similar configuration.

Figure 8:
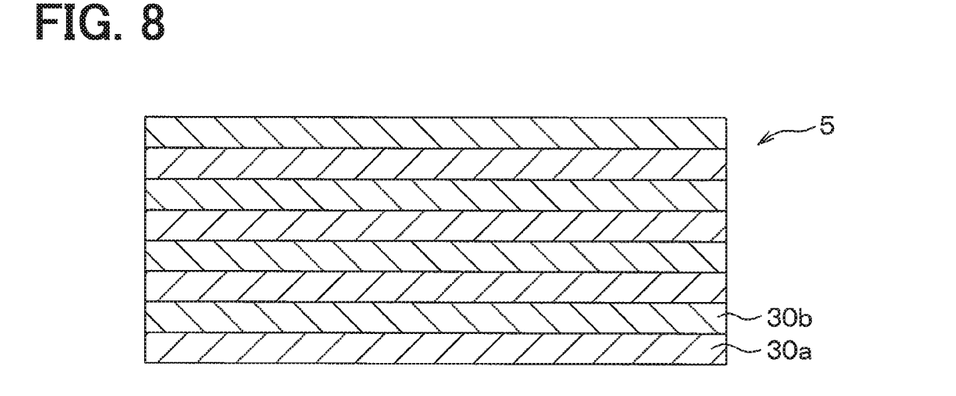
FIG. 8 is a diagram illustrating a cross-sectional view of a first joining material according to another embodiment.

That is, in the second embodiment, as shown in FIG. 8, the base layer 30a and the protective layer 30b may be alternately stacked in multiple layers.

Figure 9A:
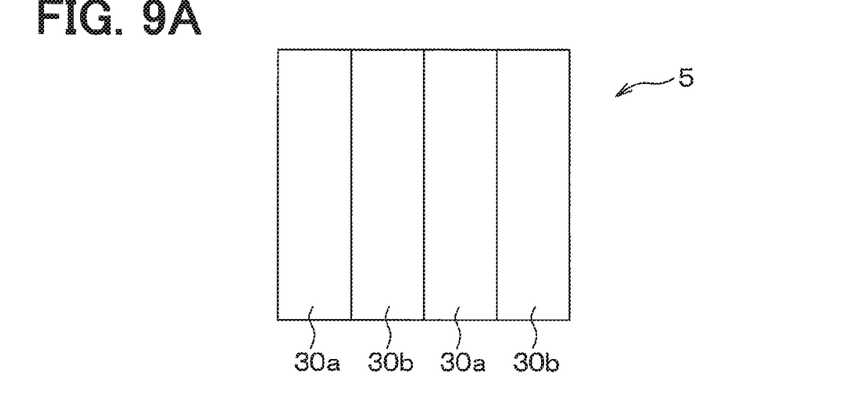
FIG. 9A is a diagram illustrating a plan view of a first joining member according to a further another embodiment.
Figure 9B:
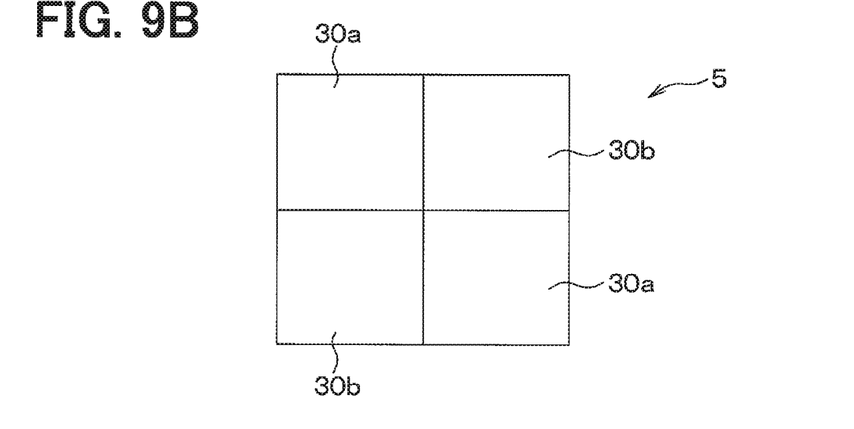
FIG. 9B is a diagram illustrating a plan view of a first joining member according to a still another embodiment.

In the third embodiment, the base layer 30a and the protective layer 30b may be divided into a plurality of sections in the planar direction. For example, as shown in FIG. 9A, the base layer 30a and the protective layer 30b may be divided into stripes. As another example, the base layer 30a and the protective layer 30b may be sectioned so as to be point symmetric with respect to the center. The area ratio between the base layer 30a and the protective layer 30b is not limited to 1:1, but may be preferably set according to the characteristics of the semiconductor chip 2.

Figure 10:
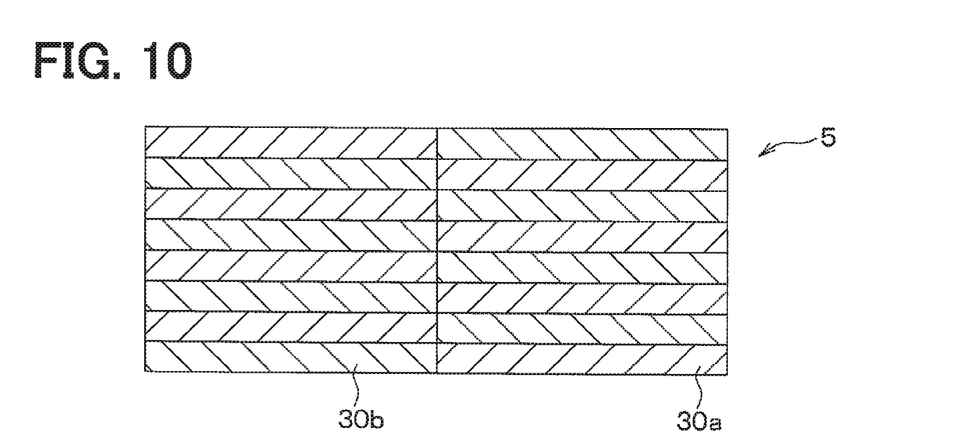
FIG. 10 is a diagram illustrating a cross-sectional view of a first joining member according to a yet another embodiment.

In the fourth embodiment, the base layers 30a may be arranged without connected in the stacking direction, as shown in FIG. 10. Further, although not specifically illustrated, the protective layers 30b may be connected in the stacking direction.

In the first to fifth embodiments, the heat radiation block 3 and the third joint member 7 may not be provided. That is, only the second joining member 6 may be arranged between the semiconductor chip 2 and the second heat radiation member 4. In this case, it is preferable to appropriately increase the thickness of the second joining member 6 according to the characteristics of the semiconductor chip 2. For example, in the configuration without having the heat radiation block 3 and the third joining member 7, the thickness of the second joining member 6 can be set to be substantially equal to the thickness of the second joining member 6, the heat radiation block 3 and the third joining member 7 of the configuration in FIG. 1. In other words, the heat radiation block 3 in FIG. 1 may also be provided by the joining member.

Further, in the fifth embodiment, in addition to the gate pad 20, at least one of the gate wiring 21 or the gate electrode 17, that is, one of or both of the gate wiring 21 and the gate electrode 17 may be provided by the base material and the protective material. Instead of the gate pad 20, at least one of the gate wiring 21 or the gate electrode 17, that is, one of or both of the gate wiring 21 and the gate electrode 17 may be provided by the base material and the protective material. That is, in the semiconductor chip 2, when a portion applied with the driving signal is referred to as the electrode portion, at least a part of the electrode portion may be provided by the base material and the protective material.

In the fifth embodiment, at least one of the upper electrode 19 and the lower electrode 24 may be provided by the base material and the protective material. In such a case, at the portion including the protective material, since the resistivity of the protective material increases as the temperature of the semiconductor chip 2 increases, the same configuration as each of the above embodiments can be attained. In the case of such a configuration, the first joining member 5, the second joining member 6, and the third joining member 7 may be provided by only Ag, which is as the base material.

In the fifth embodiment, the configurations of the second to fourth embodiments may be combined so as to include the base layers 30a and the protective layers 30b.

Further, in the fifth embodiment, the semiconductor chip 2 may not be limited to the one in which the current flows in the thickness direction of the semiconductor chip 2, but may be a semiconductor chip in which a current flows in a planar direction.

What is claimed is:

1. A semiconductor device comprising:
a semiconductor chip having an electrode portion; and
a joining member electrically connected to the electrode portion to allow an electric current to flow in the semiconductor chip through the joining member, wherein
the joining member contains a protective material that has a positive temperature coefficient of resistivity, the positive temperature coefficient of resistivity having a larger value in a temperature range higher than a threshold temperature than in a temperature range lower than the threshold temperature, the threshold temperature being a predetermined temperature lower than a breakdown temperature of the semiconductor chip,
the joining member contains a base material that has a resistivity lower than that of the protective material, in addition to the protective material,
the base material is made of silver,
the protective material is made of a metal oxide, and
the semiconductor chip has a gate pad that includes the protective material, which automatically turns off the semiconductor chip in response to a resistivity change in the conductive material lowering the driving voltage applied to the gate pad below the threshold voltage of the semiconductor chip.

2. The semiconductor device according to claim 1, wherein
the joining member includes a protective layer and a base layer, and
the protective layer is made of the protective material and the base layer is made of the base material.

3. The semiconductor device according to claim 2, wherein
the joining member is configured by a stack of the protective layer and the base layer.

4. The semiconductor device according to claim 3, wherein
the joining member is configured by a stack of the protective layers and the base layers in which the base layers are connected to each other in a stacking direction of the protective layers and the base layers.

5. The semiconductor device according to claim 2, wherein
the joining member is configured in such a manner that the protective layer and the base layer are sectioned in a planar direction of the semiconductor chip.

6. The semiconductor device according to claim 1, further comprising:
a first heat radiation member; and
a second heat radiation member disposed opposite to the first heat radiation member with respect to the semiconductor chip, wherein
the semiconductor chip has a first electrode and a second electrode, as the electrode portion,
the first electrode is disposed on a side adjacent to the first heat radiation member, and the second electrode is disposed on a side adjacent to the second heat radiation member, and
the joining member is disposed between the first heat radiation member and the first electrode and between the second heat radiation member and the second electrode to electrically connect between the first heat radiation member and the first electrode and between the second heat radiation member and the second electrode.

7. A semiconductor chip comprising:
an electrode portion; and
a semiconductor element, wherein
the electrode portion contains a protective material that has a positive temperature coefficient of resistivity, the positive temperature coefficient of resistivity having a larger value in a temperature range higher than a threshold temperature than in a temperature range lower than the threshold temperature, the threshold temperature being a predetermined temperature lower than a breakdown temperature of the semiconductor element.

8. The semiconductor chip according to claim 7, wherein
the electrode portion contains a base material that has a resistivity lower than that of the protective material, in addition to the protective material.

9. The semiconductor chip according to claim 7, further comprising:
a channel layer;
a gate electrode disposed in the channel layer through an insulating film;
a gate pad electrically connected to an external member; and
a gate wiring electrically connecting the gate pad and the gate electrode, wherein
the channel layer is configured to form an inversion layer when the gate pad is applied with a predetermined driving voltage,
the gate electrode, the gate pad, and the gate wiring are included in the electrode portion, and
at least one of the gate electrode, the gate pad or the gate wiring contains the protective material.

10. The semiconductor chip according to claim 7, further comprising:
a first electrode; and
a second electrode that allows an electric current between the first electrode and the second electrode, wherein
at least one of the first electrode or the second electrode is included in the electrode portion.

* * * * *

UNITED STATES PATENT AND TRADEMARK OFFICE
CERTIFICATE OF CORRECTION

PATENT NO. : 10,943,847 B2
APPLICATION NO. : 16/216044
DATED : March 9, 2021
INVENTOR(S) : Sugiura et al.

Page 1 of 1

It is certified that error appears in the above-identified patent and that said Letters Patent is hereby corrected as shown below:

On the Title Page

Item [73], should read:
-- DENSO CORPORATION, Kariya-city, Japan --

Signed and Sealed this
Fourth Day of January, 2022

Drew Hirshfeld
*Performing the Functions and Duties of the*
*Under Secretary of Commerce for Intellectual Property and*
*Director of the United States Patent and Trademark Office*